(12) United States Patent
Chuang et al.

(10) Patent No.: US 11,061,339 B2
(45) Date of Patent: Jul. 13, 2021

(54) APPARATUS FOR CONTAINING A SUBSTRATE AND METHOD OF MANUFACTURING THE APPARATUS

(71) Applicant: GUDENG PRECISION INDUSTRIAL CO., LTD., New Taipei (TW)

(72) Inventors: Chia-Ho Chuang, New Taipei (TW); Hsin-Min Hsueh, New Taipei (TW); Ming-Chien Chiu, New Taipei (TW)

(73) Assignee: GUDENG PRECISION INDUSTRIAL CO., LTD., New Taipei (TW)

( * ) Notice: Subject to any disclaimer, the term of this patent is extended or adjusted under 35 U.S.C. 154(b) by 0 days.

(21) Appl. No.: 16/704,086

(22) Filed: Dec. 5, 2019

(65) Prior Publication Data

US 2021/0033989 A1    Feb. 4, 2021

(30) Foreign Application Priority Data

Jul. 30, 2019    (TW) .................................. 108127001

(51) Int. Cl.
*G03F 7/20* (2006.01)
(52) U.S. Cl.
CPC ........ *G03F 7/7075* (2013.01); *G03F 7/70733* (2013.01); *G03F 7/70741* (2013.01); *G03F 7/70808* (2013.01); *G03F 7/70916* (2013.01); *G03F 7/70925* (2013.01); *G03F 7/70975* (2013.01)

(58) Field of Classification Search
CPC .... G03F 1/66; G03F 7/70733; G03F 7/70741; G03F 7/7075; G03F 7/70808; G03F 7/70916; G03F 7/70925; G03F 7/70975; H01L 21/6773
USPC ........................ 206/710; 355/30, 75; 414/935
See application file for complete search history.

(56) References Cited

U.S. PATENT DOCUMENTS 5,353,934 A * 10/1994 Yamauchi ................. G03F 1/66
206/454

* cited by examiner

*Primary Examiner* — Colin W Kreutzer
(74) *Attorney, Agent, or Firm* — Locke Lord LLP; Tim Tingkang Xia, Esq.

(57) ABSTRACT

An apparatus for containing a substrate and a method of manufacturing the apparatus are provided. The apparatus for containing a substrate includes: a base having a periphery and an upward-facing top horizontal planar surface with a plurality of contact elements, the contact elements being used for engaging the substrate to hold the substrate upon the upward-facing top horizontal planar surface, an upward-facing frame-like support surface extending from the upward-facing top horizontal planar surface and surrounding the contact elements at a position proximate to the periphery of the base; and a cover having a downward-facing frame-like support surface being in large-area contact with the upward-facing frame-like support surface to define a cavity for containing the substrate between the base and the cover. The downward-facing and upward-facing frame-like support surfaces in contact with each other are not at the same level as the upward-facing top horizontal planar surface.

12 Claims, 8 Drawing Sheets

APPARATUS FOR CONTAINING A SUBSTRATE AND METHOD OF MANUFACTURING THE APPARATUS

CROSS-REFERENCE TO RELATED APPLICATIONS

This non-provisional application claims priority under 35 U.S.C. § 119(a) on Patent Application No(s). 108127001 filed in Taiwan, R.O.C. on Jul. 30, 2019, the entire contents of which are hereby incorporated by reference.

BACKGROUND OF THE INVENTION

Field of the Invention

The present disclosure relates to a Standardized Mechanical Interface (SM IF) container for storing, transporting and processing substrates, such as reticles and wafers, and in particular to an apparatus for containing a substrate and a method of manufacturing the apparatus, wherein the apparatus is conducive to particle control and cleanliness.

Description of the Prior Art

Lithography is one of the important processes in semiconductor fabrication. Reticle substrates used in a lithographic process and adapted to attain patterning must be kept clean, because particles attached to surfaces of the reticle substrates during the process are likely to damage the surfaces of the reticle substrates and thereby diminish the quality of images upon exposure, lowering product yield. Hence, regardless of where they are, i.e., in the course of manufacturing, processing, loading, transportation, and storage, the reticle substrates must always be protected not only against contamination, but also against a collision or a rub which might otherwise generate particles to the detriment of the cleanliness of the reticle substrates.

Since particles are harmful to semiconductor fabrication, reticle substrates must be kept within highly clean reticle pods for transportation and storage. However, in a lithographic process, reticle pods are vulnerable to an unfavorable environment, an impact and vibration, and in consequence particles intrude into a reticle pod through a gap thereof, especially the gap between a cover and a base of the reticle pod even though the cover and the base are in contact with each other. Furthermore, in the lithographic process, a reticle pod is transferred to a machine and then opened so as for a reticle to be taken out of the reticle pod. Before the reticle pod is opened, intake and exhaustion are carried out to render the operating environment dust-free; however, the intake and exhaustion cause variations in pressure inside and outside the reticle pod, causing particles to intrude into the reticle pod through a gap between the cover and the base which are in contact with each other.

Therefore, a process of manufacturing a conventional reticle pod involves cutting a contact surface of the cover and a contact surface of the base (the contact surface of the cover is in contact with the contact surface of base) to render the contact surface of the cover flat and render the contact surface of the base flat. However, no conventional cutting process can attain absolute flatness of the contact surfaces of the cover and base, and in consequence, thanks to air current, some particles manage to intrude into the reticle pod through the gap. Therefore, an additional polishing process is performed on the contact surface of the cover and the contact surface of the base to enhance the flatness of the contact surfaces, albeit incurring higher processing costs.

Referring to FIG. 1, there is shown an exploded view of a conventional reticle pod. The conventional reticle pod comprises a cover 10 and a base 30. When the cover 10 and the base 30 come into contact with each other properly, the cover 10 and the base 30 jointly define a cavity therebetween. The cavity contains a reticle 20. The reticle 20 has a top surface 21 and a bottom surface 22. The bottom surface 22 is a patterned surface. When the reticle 20 is contained in the reticle pod, the bottom surface 22 faces downward, thereby facing the base 30. The base 30 has an upward-facing top horizontal planar surface 31. A plurality of contact elements 321, 322 is disposed on the upward-facing top horizontal planar surface 31. The contact elements 322 are post-like and define a region which accommodates a reticle. The contact elements 321 each have a round top surface and are located within the accommodation region for the reticle. The contact elements 321 support the bottom surface 22 of the reticle 20. The periphery of the upward-facing top horizontal planar surface 31 extends horizontally to form an upward-facing frame-like support surface 33 with a width. The upward-facing frame-like support surface 33 surrounds the contact elements 321, 322, helping the cover 10 to shut.

Referring to FIG. 2 and FIG. 3, there is shown in FIG. 2 a cross-sectional view of the conventional reticle pod shown in FIG. 1, with a reticle contained in the shut reticle pod, and there is shown in FIG. 3 an enlarged view of the right end of the cross-sectional view shown in FIG. 2. The cover 10 has a top surface 11 and a bottom surface 12. The periphery of the bottom surface 12 corresponds in position to the upward-facing frame-like support surface 33 of the base 30 and extends downward to form a flange 13 surrounding the bottom surface 12. The flange has a downward-facing frame-like support surface 132. The downward-facing frame-like support surface 132 and the upward-facing frame-like support surface 33 are in contact with each other at the same level as the upward-facing top horizontal planar surface 31. The upward-facing frame-like support surface 33 and the upward-facing top horizontal planar surface 31 undergo a grinding or polishing process to attain the same degree of surface roughness. To increase the tightness of fitting the downward-facing frame-like support surface 132 and the upward-facing frame-like support surface 33 together, it is necessary for the downward-facing and upward-facing frame-like support surfaces 132, 33 to have the same degree of surface roughness.

With the downward-facing and upward-facing frame-like support surfaces 132, 33 being in contact with each other at the same level as the upward-facing top horizontal planar surface 31, the shortest route the particles take to intrude into the reticle pod is through a gap between the downward-facing and upward-facing frame-like support surfaces 132, 33 and then moves horizontally when driven by an air current. As a result, the way in which the downward-facing and upward-facing frame-like support surfaces 132, 33 are in contact with each other is undesirably conducive to the advance of the particles. In general, an additional grinding or polishing process is required to increase the tightness of fitting the downward-facing frame-like support surface 132 and the upward-facing frame-like support surface 33 together to roughness average (Ra) of 0.50 microinch, preferably 0.2 to 0.4 microinch. However, the additional grinding or polishing process not only adds to the time taken to perform a processing process on the reticle pod, but also decreases production yield.

With lithography being increasingly sophisticated (for example, extreme ultraviolet lithography (EUV)), the demand for prevention of intrusion of particles into reticle pods is on the rise. Hence, the present disclosure provides a novel apparatus for containing a substrate and a method of manufacturing the apparatus, with a view to preventing particle intrusion and contamination, enhancing ease of manufacturing, and thereby increasing its industrial applicability.

SUMMARY OF THE INVENTION

An objective of the present disclosure is to provide an apparatus for containing a substrate and a method of manufacturing the apparatus, with a view to stopping advance of particles which might otherwise intrude into a reticle pod through a gap between a cover and a base of the reticle pod.

To achieve at least the above objective, the present disclosure provides an apparatus for containing a substrate, such as a reticle, the substrate having a top surface, a bottom surface, four lateral surfaces and four corners, comprising: a base having a periphery and an upward-facing top horizontal planar surface with a plurality of contact elements thereon, the contact elements being used for engaging the substrate to hold the substrate upon the upward-facing top horizontal planar surface, the upward-facing top horizontal planar surface extending to form an upward-facing frame-like support surface, the upward-facing frame-like support surface surrounding the contact elements at a position proximate to the periphery of the base; and a cover having a downward-facing frame-like support surface, wherein the downward-facing frame-like support surface and the upward-facing frame-like support surface are in large-area contact with each other to not only define a cavity for containing the substrate between the base and the cover, but also not be at a same level as the upward-facing top horizontal planar surface of the base.

To achieve at least the above objective, the present disclosure provides an apparatus for containing a substrate, comprising: a base having a top surface and a periphery, wherein a plurality of contact elements is disposed on the base and adapted to engage the substrate so as to hold the substrate upon the top surface, the top surface extends to form an upward-facing frame-like support surface, the upward-facing frame-like support surface surrounds the contact elements at a position proximate to the periphery of the base, and the upward-facing frame-like support surface is not parallel to the top surface; and a cover having a bottom surface and a flange surrounding the bottom surface, the flange having a downward-facing frame-like support surface, wherein the downward-facing frame-like support surface and the upward-facing frame-like support surface are in large-area contact with each other such that the substrate is contained between the top surface of the base and the bottom surface of the cover, wherein the downward-facing frame-like support surface of the flange and the bottom surface differ in height.

To achieve at least the above objective, the present disclosure provides an apparatus for containing a substrate, the substrate having a top surface, a bottom surface, four lateral surfaces and four corners, comprising: a base having a periphery and a top surface with a plurality of contact elements thereon, the contact elements being used for engaging the substrate to hold the substrate upon the top surface, the top surface extending to form an upward-facing frame-like support surface, the upward-facing frame-like support surface surrounding the contact elements at a position proximate to the periphery of the base, wherein at least a portion of the upward-facing frame-like support surface is not at a same level as the top surface; and a cover having a downward-facing frame-like support surface, wherein the downward-facing frame-like support surface and the upward-facing frame-like support surface engage with each other to define between the base and the cover a cavity for containing the substrate.

To achieve at least the above objective, the present disclosure provides an apparatus for containing a substrate, comprising: a base having a top surface, an upward-facing frame-like support surface and a groove disposed between the top surface and the upward-facing frame-like support surface, the base having thereon a plurality of contact elements for engaging the substrate to hold the substrate upon the top surface, wherein at least a portion of the upward-facing frame-like support surface is not at a same level as the top surface, a sidewall defined at the groove and positioned proximate to the top surface is higher than a sidewall defined at the groove and positioned proximate to the upward-facing frame-like support surface; and a cover having a bottom surface and a flange surrounding the bottom surface, the flange having a downward-facing frame-like support surface, wherein the downward-facing frame-like support surface and the upward-facing frame-like support surface match such that a substrate is contained between the top surface of the base and the bottom surface of the cover, and a portion of the downward-facing frame-like support surface of the flange extends into the groove of the base.

To achieve at least the above objective, the present disclosure provides an apparatus for containing a substrate, comprising: a base having a top surface, an upward-facing frame-like support surface and a groove disposed between the top surface and the upward-facing frame-like support surface, the base having thereon a plurality of contact elements for holding the substrate upon the top surface, wherein at least a portion of the upward-facing frame-like support surface is not at a same level as the top surface; and a cover having a bottom surface and a flange surrounding the bottom surface, the flange having a downward-facing frame-like support surface and an inner lateral surface extending downward from the bottom surface to the downward-facing frame-like support surface, wherein the downward-facing frame-like support surface and the upward-facing frame-like support surface engage with each other to contain a substrate between the top surface of the base and the bottom surface of the cover, wherein a height of the inner lateral surface of the flange is greater than a distance between the top surface and the bottom surface.

To achieve at least the above objective, the present disclosure provides an apparatus for containing a substrate, comprising: a base having a top surface, an upward-facing frame-like support surface and a groove disposed between the top surface and the upward-facing frame-like support surface, the base having thereon a plurality of contact elements for holding the substrate upon the top surface, wherein at least a portion of the upward-facing frame-like support surface is not at a same level as the top surface; and a cover having a bottom surface and a downward-facing frame-like support surface, wherein the downward-facing frame-like support surface and the upward-facing frame-like support surface are in large-area contact with each other to contain a substrate between the base and the cover, wherein height varies from the downward-facing frame-like support surface to the bottom surface.

To achieve at least the above objective, the present disclosure provides a method of manufacturing an apparatus for containing a substrate, comprising the steps of: processing a base such that the base has a top surface, and the top surface extends to form an upward-facing frame-like support surface, wherein at least a portion of the upward-facing frame-like support surface is not at a same level as the top surface; disposing a plurality of contact elements on the base, wherein the contact elements are surrounded by the upward-facing frame-like support surface and adapted to be in contact with a substrate so as to hold the substrate upon the top surface; and processing a cover to allow the cover to form a frame-like flange having a downward-facing frame-like support surface being in large-area contact with and engaging with the upward-facing frame-like support surface of the base.

To achieve at least the above objective, the present disclosure provides a method of manufacturing an apparatus for containing a substrate, comprising the steps of: processing a base such that the base has a top surface, an upward-facing frame-like support surface and a groove disposed between the top surface and the upward-facing frame-like support surface, and at least a portion of the upward-facing frame-like support surface is not at a same level as the top surface; disposing a plurality of contact elements on the base, wherein the contact elements are surrounded by the upward-facing frame-like support surface and adapted to be in contact with a substrate so as to hold the substrate upon the top surface; and processing a cover such that the cover has a downward-facing frame-like support surface being in large-area contact with and engaging with the upward-facing frame-like support surface of the base.

According to the present disclosure, an apparatus for containing a substrate and a method of manufacturing the apparatus have advantages as follows: when the cover and the base are in contact with each other and engaged with each other, owing to the contact surface structure between the cover and the base, the air current which has entered the cavity advances not at the same level as the top surface of the base; and the surface roughness of the contact surfaces need not attain roughness average of 0.2 to 0.4 microinch but can still effectively stop the advance of particles to therefore render the apparatus particle-free and contamination-free and provide a method of manufacturing of the apparatus with enhanced ease of manufacturing.

DETAILED DESCRIPTION OF THE EMBODIMENTS

Figure 1:
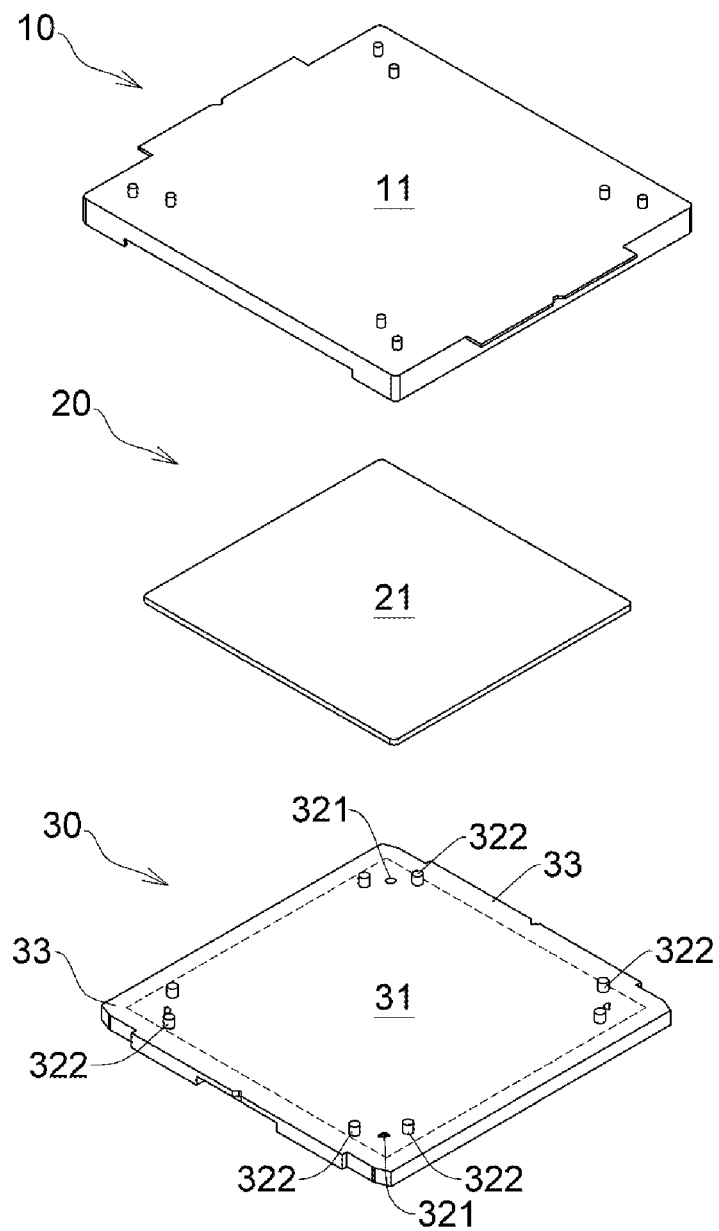
FIG. 1 is an exploded view of a conventional reticle pod.
Figure 2:
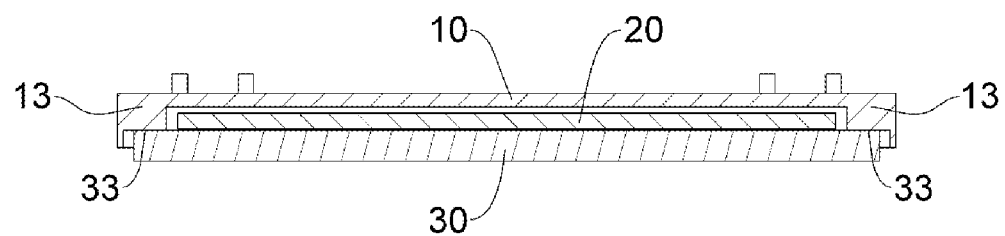
FIG. 2 is a cross-sectional view of the conventional reticle pod shown in FIG. 1, with a reticle contained in the shut reticle pod.

In the first embodiment of the present disclosure, an apparatus for containing a substrate is adapted to contain a substrate 20, such as a reticle. The substrate 20 has a top surface 21, a bottom surface 22, four lateral surfaces and four corners. According to the present disclosure, the apparatus for containing a substrate comprises a base 30 and a cover 10. The apparatus for containing a substrate according to the present disclosure is distinguished from the conventional reticle pod shown in FIG. 1 only by the contact surface of the cover 10 and the contact surface of the base 30. The contact surface of the conventional reticle pod is a flat horizontal planar surface which is at the same level as the upward-facing top horizontal planar surface 31, wherein the contact surfaces 132, 33 and the upward-facing top horizontal planar surface 31 are equal in surface roughness. Regarding the apparatus for containing a substrate according to the present disclosure, its contact surface structure is not at the same level as the upward-facing top horizontal planar surface 31 of the base 30.

In the first embodiment of the present disclosure, the base 30 of the apparatus for containing a substrate has a periphery and an upward-facing top horizontal planar surface 31, wherein a plurality of contact elements 321, 322 is disposed on the upward-facing top horizontal planar surface 31 to support and restrain the four corners of the substrate 20 so as to hold the substrate 20 upon the upward-facing top horizontal planar surface 31. The periphery of the upward-facing top horizontal planar surface 31 surrounds the contact elements 321, 322 and extends outward to form an upward-facing frame-like support surface 33 at a position proximate to the periphery. The cover 10 of the apparatus for containing a substrate has a top surface 11, a bottom surface 12 and a flange 13 surrounding the bottom surface 12 and extending downward from the bottom surface 12. The flange 13 has a downward-facing frame-like support surface 132 and an inner lateral surface 131 extending downward from the bottom surface 12 to the downward-facing frame-like support surface 132. When the downward-facing frame-like support surface 132 is in large-area contact with the upward-facing frame-like support surface 33, the upward-facing top horizontal planar surface 31 of the base 30, the bottom surface 12 of the cover 10, and the inner lateral surface 131 of the flange 13 jointly define a cavity for containing the substrate 20, such as a reticle.

Figure 3:
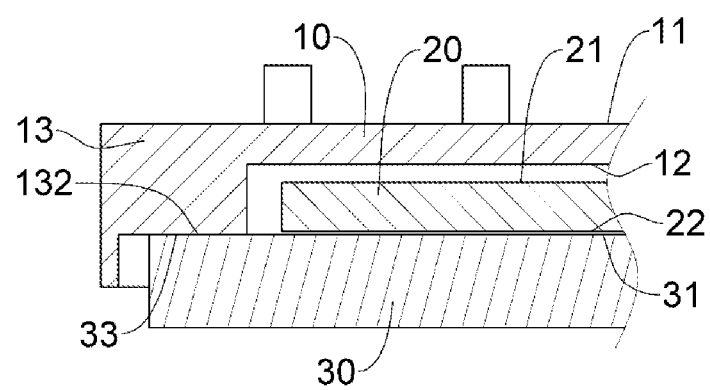
FIG. 3 is an enlarged view of the right end of the cross-sectional view shown in FIG. 2.
Figure 4A:
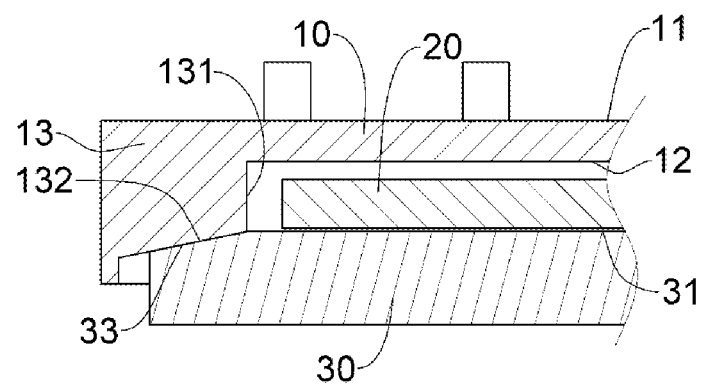
FIG. 4A through FIG. 4D are cross-sectional views of an apparatus for containing a substrate according to the first embodiment of the present disclosure, showing different aspects of its contact surface structure.
Figure 4B:
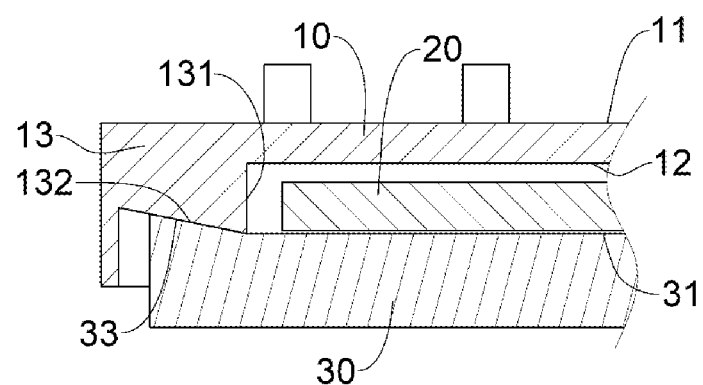

Referring to FIG. 4A through FIG. 4D, there are shown cross-sectional views of an apparatus for containing a substrate according to the first embodiment of the present disclosure, showing different aspects of its contact surface structure. The contact surface structure comprises the downward-facing frame-like support surface 132 of the cover 10 and the upward-facing frame-like support surface 33 of the base 30 which are in contact with each other and engage with each other. Referring to FIG. 4A and FIG. 4B, the upward-facing frame-like support surface 33 slopes down (as shown in FIG. 4A) or up (as shown in FIG. 4B) from the upward-facing top horizontal planar surface 31 to the periphery of the base 30, allowing the downward-facing and upward-facing frame-like support surfaces 132, 33 not to be at the same level as the upward-facing top horizontal planar surface 31. The downward-facing frame-like support surface 132, which is in contact with and engages with the upward-facing frame-like support surface 33, slopes down (as shown in FIG. 4A) or up (as shown in FIG. 4B) from the junction of the upward-facing top horizontal planar surface 31 and the lower edge of the inner lateral surface 131, and in consequence the flange 13 extends downward from the bottom surface 12 by different distances. Therefore, the route which the downward-facing and upward-facing frame-like support surfaces 132, 33 take from the upward-facing top horizontal planar surface 31 to the periphery of the base 30 is longer in FIGS. 4A, 4B than in FIG. 3, so as to effectively stop the particles from intruding into the cavity containing the substrate 20 via the outer edges of the downward-facing and upward-facing frame-like support surfaces 132, 33 (the periphery of the base 30).

Figure 4C:
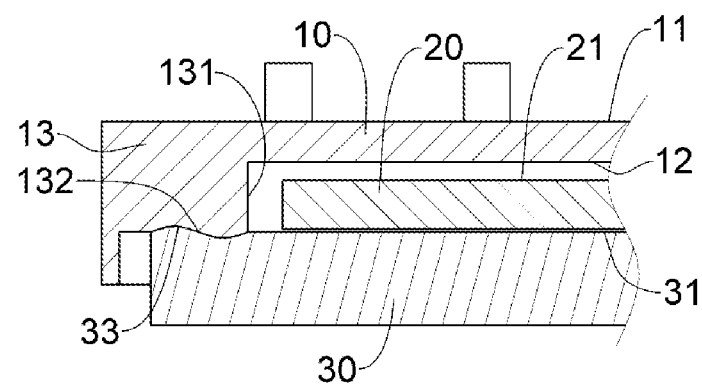

Referring to FIG. 4C, the upward-facing frame-like support surface 33 extends from the upward-facing top horizontal planar surface 31 to the periphery of the base 30 by sagging and rising alternately and gradually such that the downward-facing frame-like support surface 132 and at least a portion of the upward-facing frame-like support surface 33 are not at the same level as, or are not parallel to, the upward-facing top horizontal planar surface 31. The downward-facing frame-like support surface 132, which is in contact with and engages with the upward-facing frame-like support surface 33, extends from the junction of the upward-facing top horizontal planar surface 31 and the lower edge of the inner lateral surface 131 to the outer edge of the downward-facing frame-like support surface 132 by sagging and rising alternately and gradually (as shown in FIG. 4C), and in consequence the flange 13 extends downward from the bottom surface 12 by different distances. Therefore, the route which the downward-facing and upward-facing frame-like support surfaces 132, 33 take from the upward-facing top horizontal planar surface 31 to the periphery of the base 30 is longer in FIG. 4C than in FIG. 3 and FIGS. 4A, 4B, so as to effectively stop the particles from intruding into the cavity containing the substrate 20 via the outer edges of the downward-facing and upward-facing frame-like support surfaces 132, 33 (the periphery of the base 30), so as to effectively stop the particles from intruding into the cavity containing the substrate 20 via the outer edges of the downward-facing and upward-facing frame-like support surfaces 132, 33 (the periphery of the base 30).

Figure 4D:
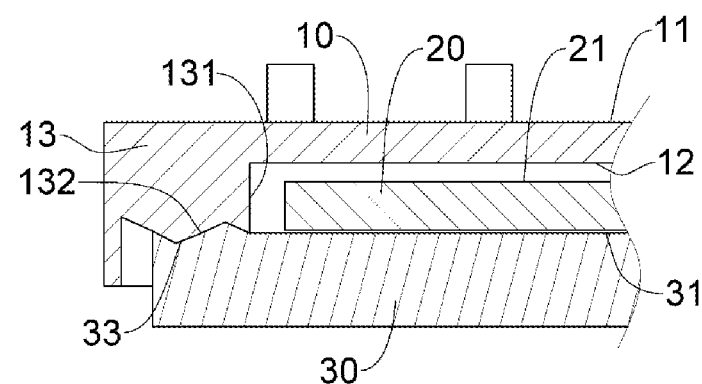

Referring to FIG. 4D, the upward-facing frame-like support surface 33 extends from the upward-facing top horizontal planar surface 31 to the periphery of the base 30 by sagging and rising alternately and abruptly, that is, zigzag, such that the downward-facing frame-like support surface 132 and at least a portion of the upward-facing frame-like support surface 33 are not at the same level as, or are not parallel to, the upward-facing top horizontal planar surface 31. The downward-facing frame-like support surface 132, which is in contact with and engages with the upward-facing frame-like support surface 33, extends zigzag from the junction of the upward-facing top horizontal planar surface 31 and the lower edge of the inner lateral surface 131 to the outer edge of the downward-facing frame-like support surface 132, so as for the flange 13 to extend downward from the bottom surface 12 by different distances. Therefore, the route which the downward-facing and upward-facing frame-like support surfaces 132, 33 take from the upward-facing top horizontal planar surface 31 to the periphery of the base 30 is longer in FIG. 4D than in FIG. 3, FIG. 4A and FIG. 4B, so as to effectively stop the particles from intruding into the cavity containing the substrate 20 via the outer edges of the downward-facing and upward-facing frame-like support surfaces 132, 33 (the periphery of the base 30).

Figure 5:
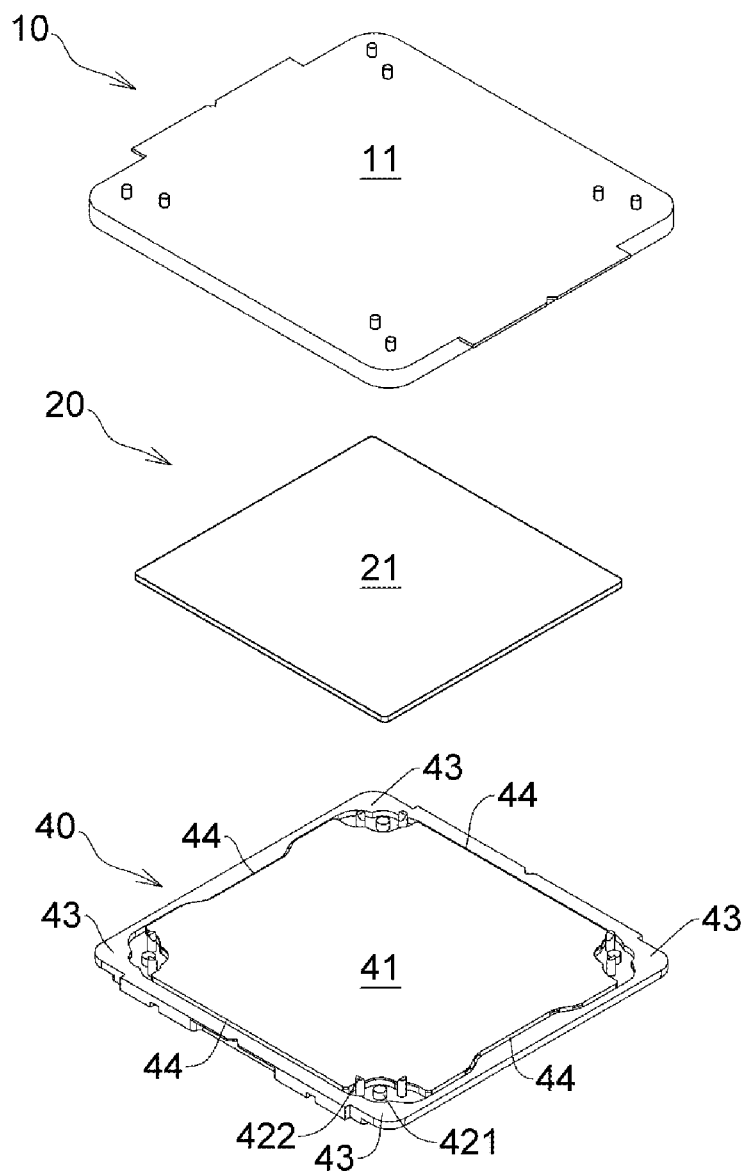
FIG. 5 is an exploded view of an apparatus for containing a substrate according to the second embodiment of the present disclosure.
Figure 6A:
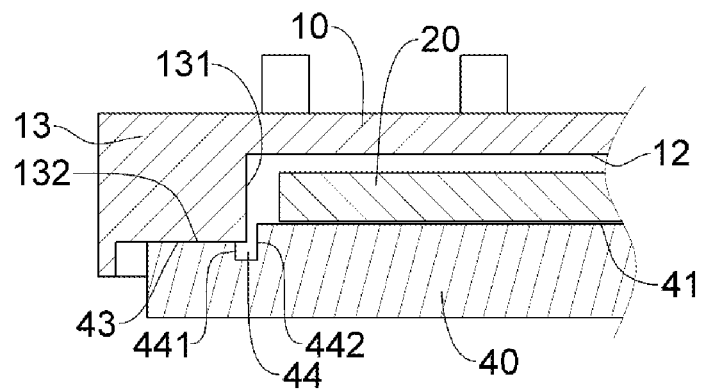
FIG. 6A through FIG. 6F are cross-sectional views of an apparatus for containing a substrate according to the second embodiment of the present disclosure, showing different aspects of its contact surface structure.

Referring to FIG. 5, there is shown an exploded view of an apparatus for containing a substrate according to the second embodiment of the present disclosure. In the second embodiment of the present disclosure, the apparatus for containing a substrate is adapted to contain a substrate 20, such as a reticle. The substrate 20 has a top surface 21, a bottom surface 22, four lateral surfaces and four corners. The apparatus for containing a substrate according to the present disclosure comprises a base 40 and a cover 10. The base 40 has a top surface 41, an upward-facing frame-like support surface 43, and a groove 44 disposed between the top surface 40 and the upward-facing frame-like support surface 43. The groove 44 follows a frame-like path. The top surface 41 and the upward-facing frame-like support surface 43 differ in height. The groove 44 has a sidewall 442 positioned proximate to the top surface 41, a sidewall 441 positioned proximate to the upward-facing frame-like support surface 43, and a bottom disposed between the sidewalls 441, 442 and having a width. The sidewall 442 is of a greater height than the sidewall 441, as shown in FIG. 6A. The upward-facing frame-like support surface 43 forms a wide surface and is disposed between the groove 44 and the periphery of the base 40.

In the second embodiment of the present disclosure, the base 40 has thereon a plurality of contact elements 421, 422 being used for engaging the substrate 20 to hold the substrate 20 upon the top surface 41. The contact elements 422 are each post-like to restrain the four corners of the substrate 20. Each said contact element 421 is disposed between two said contact elements 422 and has a round top surface to support the bottom surface 22 of the substrate 20 near the four corners. Two said contact elements 422 and one said contact element 421 are integrally formed as a unitary component such that four unitary components are mounted inside the groove 44 and correspond in position to the four corners of the substrate 20, respectively, as shown in FIG. 5. In a variant embodiment of the present disclosure, like the contact elements 321, 322 shown in FIG. 1, the contact elements 421, 422 shown in FIG. 5 are disposed on the top surface 41 of the base 40 and correspond in position to the four corners of the substrate 20, respectively.

In the second embodiment of the present disclosure, the cover 10 has a top surface 11, a bottom surface 12, and a flange 13 surrounding the bottom surface 12 and extending downward from the bottom surface 12. The flange 13 has a downward-facing frame-like support surface 132 and an inner lateral surface 131 extending downward from the bottom surface 12 to the downward-facing frame-like support surface 132. When the downward-facing frame-like support surface 132 is in large-area contact with the upward-facing frame-like support surface 43, the top surface 41 of the base 40, the bottom surface 12 of the cover 10, and the inner lateral surface 131 of the flange 13 jointly define a cavity for containing a substrate 20, such as a reticle.

Referring to FIG. 6A through FIG. 6F, there are shown cross-sectional views of an apparatus for containing a substrate according to the second embodiment of the present disclosure, showing different aspects of its contact surface structure. The contact surface structure comprises the downward-facing frame-like support surface 132 of the cover 10 and the upward-facing frame-like support surface 43 of the base 40, with the downward-facing and upward-facing frame-like support surfaces 132, 43 being in contact with each other and engaging with each other. Referring to FIG. 6A, the upward-facing frame-like support surface 43 extends, in a direction parallel to the top surface 41, from the upper edge of the sidewall 441 of the groove 44 to the periphery of the base 40 such that the upward-facing frame-like support surface 43 is not at the same level as the top surface 41. The downward-facing frame-like support surface 132, which is in contact with and engages with the upward-facing frame-like support surface 43, extends, in a direction parallel to the top surface 41, from the lower edge of the inner lateral surface 131 to the outer edge of the downward-facing frame-like support surface 132. The inner edge of the downward-facing frame-like support surface 132 of the flange 13 extends into the groove 44. Preferably, the inner edge of the downward-facing frame-like support surface 132 extends by a distance equal to at least a half of the width of the groove 44. Therefore, the route which the downward-facing and upward-facing frame-like support surfaces 132, 43 take from the top surface 41 to the periphery of the base 40 is longer in FIG. 6A through FIG. 6F than in FIG. 3, whereas the lower edge of the inner lateral surface 131 of the flange 13 is lower than the top surface 41, so as to effectively stop the particles from intruding into the cavity containing the substrate 20 via the outer edges of the downward-facing and upward-facing frame-like support surfaces 132, 43 (the periphery of the base 40).

Figure 6B:
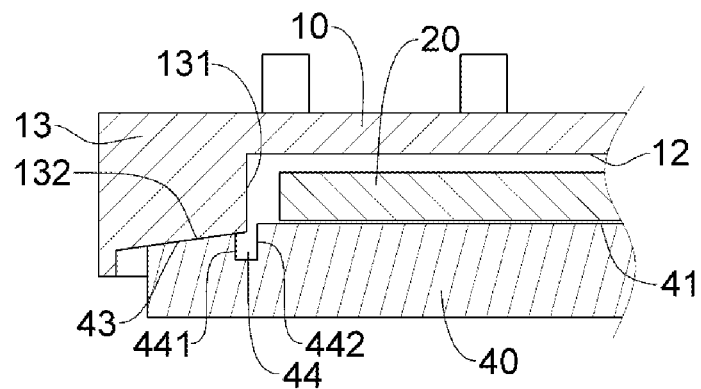
Figure 6C:
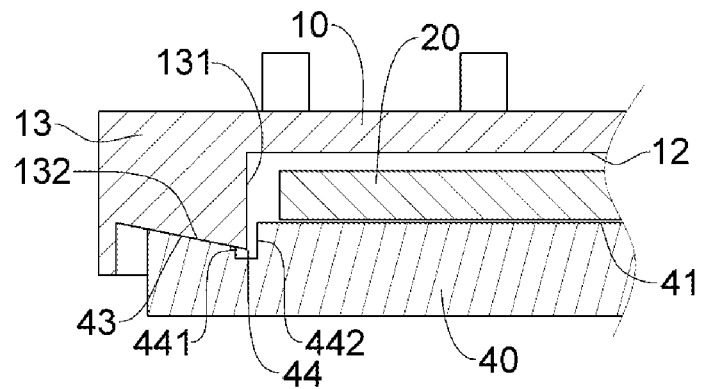

Referring to FIG. 6B and FIG. 6C, the upward-facing frame-like support surface 43 slopes down (as shown in FIG. 6B) or up (as shown in FIG. 6C) from the upper edge of the sidewall 441 of the groove 44 to the periphery of the base 40, allowing the upward-facing frame-like support surface 43 not to be at the same level as the top surface 41 of the base 40. The downward-facing frame-like support surface 132, which is in contact with and engages with the upward-facing frame-like support surface 43, slopes down (as shown in FIG. 6B) or up (as shown in FIG. 6C) from the lower edge of the inner lateral surface 131, allowing the flange 13 to extend downward from the bottom surface 12 by different distances. The inner edge of the downward-facing frame-like support surface 132 of the flange 13 extends into the groove 44. Preferably, the inner edge of the downward-facing frame-like support surface 132 extends by a distance equal to at least a half of the width of the groove 44. Therefore, the route which the downward-facing and upward-facing frame-like support surfaces 132, 43 take from the top surface 41 to the periphery of the base 40 is longer in FIG. FIG. 6B and FIG. 6C than in FIG. 3, whereas the lower edge of the inner lateral surface 131 of the flange 13 is lower than the top surface 41, so as to effectively stop the particles from intruding into the cavity containing the substrate 20 via the outer edges of the downward-facing and upward-facing frame-like support surfaces 132, 43 (the periphery of the base 40).

Figure 6D:
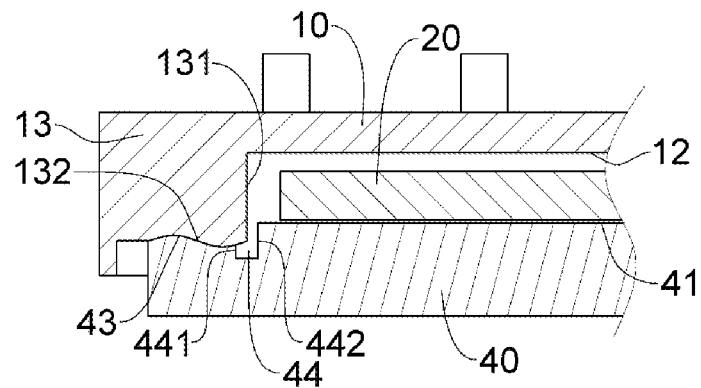

Referring to FIG. 6D, the upward-facing frame-like support surface 43 extends from the upper edge of the sidewall 441 of the groove 44 to the periphery of the base 40 by sagging and rising alternately and gradually such that the upward-facing frame-like support surface 43 is not at the same level as, or is not parallel to, the top surface 41 of the base 40. The downward-facing frame-like support surface 132, which is in contact with and engages with the upward-facing frame-like support surface 34, extends from the lower edge of the inner lateral surface 131 of the flange 13 to the outer edge of the downward-facing frame-like support surface 132 by sagging and rising alternately and gradually, allowing the flange 13 to extend downward from the bottom surface 12 by different distances. The inner edge of the downward-facing frame-like support surface 132 of the flange 13 extends into the groove 44. Preferably, the inner edge of the downward-facing frame-like support surface 132 extends by a distance equal to at least a half of the width of the groove 44. Therefore, the route which the downward-facing and upward-facing frame-like support surfaces 132, 43 take from the top surface 41 to the periphery of the base 40 is longer in FIG. 6D than in FIG. 3, FIG. 6A, and FIG. 6C, whereas the lower edge of the inner lateral surface 131 of the flange 13 is lower than the top surface 41, so as to effectively stop the particles from intruding into the cavity containing the substrate 20 via the outer edges of the downward-facing and upward-facing frame-like support surfaces 132, 43 (the periphery of the base 40).

Figure 6E:
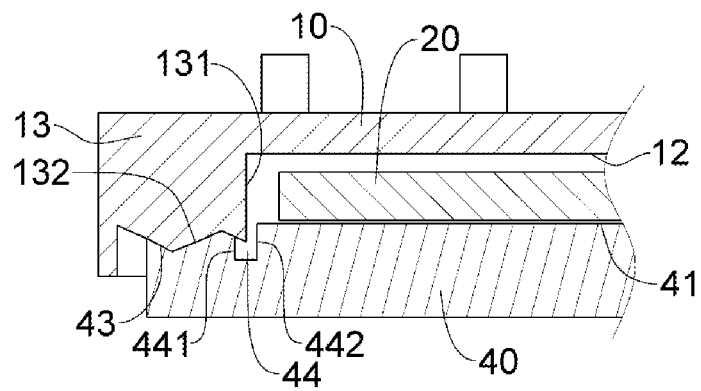

Referring to FIG. 6E, the upward-facing frame-like support surface 43 extends from the upper edge of the sidewall 441 of the groove 44 to the periphery of the base 40 by sagging and rising alternately and abruptly, that is, zigzag, such that the upward-facing frame-like support surface 43 is not at the same level as, or is not parallel to, the top surface 41 of the base 40. The downward-facing frame-like support surface 132, which is in contact with and engages with the upward-facing frame-like support surface 43, extends from the lower edge of the inner lateral surface 131 of the flange 13 to the outer edge of the downward-facing frame-like support surface 132 by sagging and rising alternately and abruptly, that is, zigzag, such that the flange 13 extends downward from the bottom surface 12 by different distances. The inner edge of the downward-facing frame-like support surface 132 of the flange 13 extends into the groove 44. Preferably, the inner edge of the downward-facing frame-like support surface 132 extends by a distance equal to at least a half of the width of the groove 44. Therefore, the route which the downward-facing and upward-facing frame-like support surfaces 132, 43 take from the top surface 41 to the periphery of the base 40 is longer in FIG. 6E than in FIG. 3, FIG. 6A and FIG. 6C, whereas the lower edge of the inner lateral surface 131 of the flange 13 is lower than the top surface 41, so as to effectively stop the particles from intruding into the cavity containing the substrate 20 via the outer edges of the downward-facing and upward-facing frame-like support surfaces 132, 43 (the periphery of the base 40).

Figure 6F:
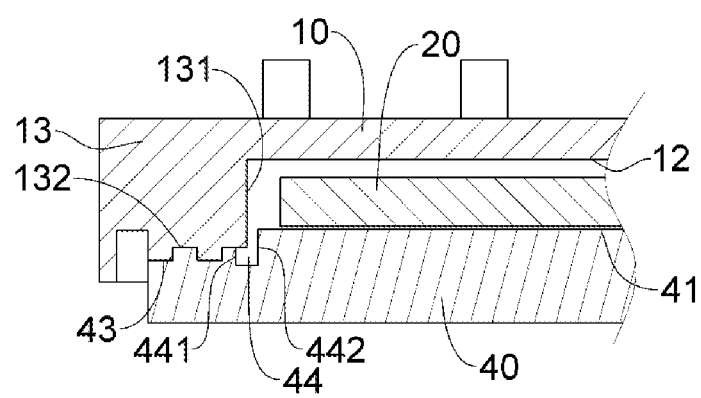

Referring to FIG. 6F, the upward-facing frame-like support surface 43 extends from the upper edge of the sidewall 441 of the groove 44 to the periphery of the base 40 by following a square-wave path, allowing the upward-facing frame-like support surface 43 not to be at the same level as the top surface 41 of the base 40. The downward-facing frame-like support surface 132, which is in contact with and engages with the upward-facing frame-like support surface 43, extends from the lower edge of the inner lateral surface 131 of the flange 13 to the outer edge of the downward-facing frame-like support surface 132 by following a square-wave path. The inner edge of the downward-facing frame-like support surface 132 of the flange 13 extends into the groove 44. Preferably, the inner edge of the downward-facing frame-like support surface 132 extends by a distance equal to at least a half of the width of the groove 44. Therefore, the route which the downward-facing and upward-facing frame-like support surfaces 132, 43 take from the top surface 41 to the periphery of the base 40 is longer in FIG. 6F than in FIG. 3, FIG. 6A and FIG. 6E, whereas the lower edge of the inner lateral surface 131 of the flange 13 is lower than the top surface 41, so as to effectively stop the particles from intruding into the cavity containing the substrate 20 via the outer edges of the downward-facing and upward-facing frame-like support surfaces 132, 43 (the periphery of the base 40).

The contact surface structure of the apparatus for containing a substrate in the second embodiment of the present disclosure is more effective in stopping particles from intruding into the cavity containing the substrate 20 than that of the conventional reticle pod. Therefore, the surface roughness of the contact surface of the cover 10 and the contact surface of the base 40 of the apparatus for containing a substrate in the second embodiment of the present disclosure need not have roughness average of 0.2 to 0.4 microinch, and in consequence according to the present disclosure the manufacturing process of reticle pods is spared any extra processing time. Furthermore, according to the present disclosure, the apparatus for containing a substrate is advantageous as follows: even though the surface roughness of the downward-facing frame-like support surface 132 and the upward-facing frame-like support surface 43 is of roughness average of 1.57 microinches to 9.33 microinches and thus is not equal to the surface roughness of the top surface 41, it can still stop particles from intruding into the cavity containing the substrate 20 via the outer edges of the downward-facing and upward-facing frame-like support surfaces 132, 43 (the periphery of the base 40).

Figure 7:
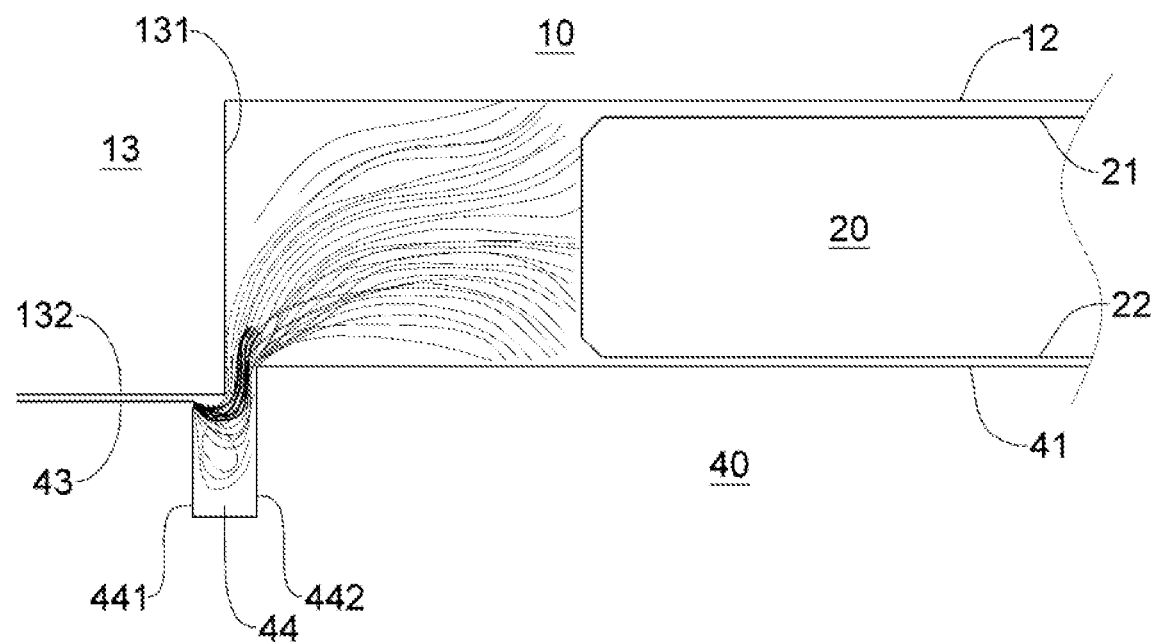
FIG. 7 is a schematic view of air current in the apparatus for containing a substrate according to the second embodiment of the present disclosure.

Referring to FIG. 7, there is shown a schematic view of air current in the apparatus for containing a substrate according to the second embodiment of the present disclosure. The contact surface structure shown in FIG. 7 is the same as that shown in FIG. 6A. According to the present disclosure, when the apparatus for containing a substrate is confronted with an external pressure greater than internal pressure, the simulation result of computational fluid dynamics (CFD) of air current generated between the downward-facing frame-like support surface 132 and the upward-facing frame-like support surface 43 is shown in FIG. 7. The lower edge of the inner lateral surface 131 of the flange 13 is lower than the top surface 41, not only because the groove 44 is formed between the upward-facing frame-like support surface 43 and the top surface 41, but also because the sidewall 442 positioned proximate to the top surface 41 is higher than the sidewall 441 positioned proximate to the upward-facing frame-like support surface 43. The inner edge of the downward-facing frame-like support surface 132 extends by a distance equal to at least a half of the width of the groove 44. Therefore, the air current generated as a result of pressure difference becomes turbulent as soon as it enters the groove 44 via the contact surface structure between the upward-facing frame-like support surface 43 and the downward-facing frame-like support surface 132. The turbulent air current is unlikely to reach the bottom of the groove 44, and in consequence particles intruding via the contact surface structure fall onto and stay at the bottom of the groove 44, so as to effectively prevent the particles from intruding into the cavity containing the substrate 20.

What is claimed is:

1. An apparatus for containing a substrate, the substrate having a top surface, a bottom surface, four lateral surfaces and four corners, comprising:
   a base having a periphery and an upward-facing top horizontal planar surface with a plurality of contact elements thereon, the contact elements being used for engaging the substrate to hold the substrate upon the upward-facing top horizontal planar surface, the upward-facing top horizontal planar surface continuously connecting with an upward-facing frame-like support surface, the upward-facing frame-like support surface surrounding the contact elements at a position proximate to the periphery of the base; and
   a cover having a downward-facing frame-like support surface, wherein the downward-facing frame-like support surface and the upward-facing frame-like support surface are in contact with each other to not only define a cavity for containing the substrate between the base and the cover, but also not be at a same level as the upward-facing top horizontal planar surface of the base.

2. The apparatus for containing a substrate according to claim 1, wherein the upward-facing frame-like support surface is flat or curved, both the upward-facing and downward-facing frame-like support surfaces have surface roughness, and the upward-facing frame-like support surface has greater surface roughness than the upward-facing top horizontal planar surface.

3. The apparatus for containing a substrate according to claim 2, wherein the downward-facing and upward-facing frame-like support surfaces match, and an average of gaps between the downward-facing and upward-facing frame-like support surfaces ranges from 0.005 mm to 0.03 mm because of the surface roughness of the downward-facing and upward-facing frame-like support surfaces.

4. An apparatus for containing a substrate, comprising:
   a base having a top surface and a periphery, wherein a plurality of contact elements is disposed on the base and adapted to engage the substrate so as to hold the substrate upon the top surface, the top surface continuously connects with an upward-facing frame-like support surface, the upward-facing frame-like support surface surrounds the contact elements at a position proximate to the periphery of the base, and the upward-facing frame-like support surface is not parallel to the top surface; and
   a cover having a bottom surface and a flange surrounding the bottom surface, the flange having a downward-facing frame-like support surface, wherein the downward-facing frame-like support surface and the upward-facing frame-like support surface are in contact with each other such that the substrate is contained between the top surface of the base and the bottom surface of the cover, wherein the downward-facing frame-like support surface of the flange and the bottom surface differ in height.

5. An apparatus for containing a substrate, the substrate having a top surface, a bottom surface, four lateral surfaces and four corners, comprising:
   a base having a periphery and a top surface with a plurality of contact elements thereon, the contact elements being used for engaging the substrate to hold the substrate upon the top surface of the base, the top surface of the base continuously connecting with an upward-facing frame-like support surface, the upward-facing frame-like support surface surrounding the contact elements at a position proximate to the periphery of the base, wherein at least a portion of the upward-facing frame-like support surface is not at a same level as the top surface of the base; and
   a cover having a downward-facing frame-like support surface, wherein the downward-facing frame-like support surface and the upward-facing frame-like support surface engage with each other to define between the base and the cover a cavity for containing the substrate.

6. The apparatus for containing a substrate according to claim 4 or 5, wherein the upward-facing and downward-facing frame-like support surfaces have surface roughness, the upward-facing frame-like support surface is flat or curved, and the upward-facing frame-like support surface has greater surface roughness than the top surface.

7. The apparatus for containing a substrate according to claim 6, wherein the downward-facing and upward-facing frame-like support surfaces match, and an average of gaps between the downward-facing and upward-facing frame-like support surfaces ranges from 0.005 mm to 0.03 mm because of the surface roughness of the downward-facing and upward-facing frame-like support surfaces.

8. A method of manufacturing an apparatus for containing a substrate, comprising the steps of:
- processing a base such that the base has a top surface, and the top surface continuously connects with an upward-facing frame-like support surface, wherein at least a portion of the upward-facing frame-like support surface is not at a same level as the top surface;
- disposing a plurality of contact elements on the base, wherein the contact elements are surrounded by the upward-facing frame-like support surface and adapted to be in contact with a substrate so as to hold the substrate upon the top surface; and
- processing a cover to allow the cover to form a frame-like flange having a downward-facing frame-like support surface being in contact with and engaging with the upward-facing frame-like support surface of the base.

9. The method of claim 8, wherein the contact elements are disposed on the top surface and located at or positioned proximate to diagonals of the top surface, respectively.

10. The method of claim 8, further comprising:
- processing the top surface and the upward-facing frame-like support surfaces separately such that the upward-facing frame-like support surface has greater surface roughness than the top surface.

11. The method of claim 8, further comprising:
- processing the upward-facing frame-like support surface such that the upward-facing frame-like support surface is flat or curved and has surface roughness of 0.5 microinch to 10 microinches.

12. The method of claim 8, further comprising:
- processing the upward-facing frame-like support surface and the downward-facing frame-like support surface such that the downward-facing and upward-facing frame-like support surfaces are flat or curved surfaces engaging with each other.

\* \* \* \* \*